United States Patent
Padhye et al.

(10) Patent No.: US 8,972,601 B2
(45) Date of Patent: Mar. 3, 2015

(54) FLYWAYS IN DATA CENTERS

(75) Inventors: Jitendra D. Padhye, Redmond, WA (US); Srikanth Kandula, Redmond, WA (US); Paramvir Bahl, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 637 days.

(21) Appl. No.: 12/723,697

(22) Filed: Mar. 15, 2010

(65) Prior Publication Data

US 2011/0087799 A1   Apr. 14, 2011

Related U.S. Application Data

(60) Provisional application No. 61/250,013, filed on Oct. 9, 2009.

(51) Int. Cl.
| | | |
|---|---|---|
| *G06F 15/16* | (2006.01) | |
| *H05K 7/14* | (2006.01) | |
| *H04L 12/64* | (2006.01) | |
| *H04L 12/24* | (2006.01) | |

(52) U.S. Cl.
CPC .......... *H05K 7/1498* (2013.01); *H04L 12/6418* (2013.01); *H04L 41/0896* (2013.01)
USPC ............................. 709/235; 709/223; 709/231

(58) Field of Classification Search
None
See application file for complete search history.

(56) References Cited

U.S. PATENT DOCUMENTS

| | | | | |
|---|---|---|---|---|
| 4,013,999 | A * | 3/1977 | Erwin et al. ................... | 382/101 |
| 6,697,365 | B1 * | 2/2004 | Messenger ..................... | 370/390 |
| 6,977,416 | B2 | 12/2005 | Nakazawa et al. | |
| 7,590,727 | B1 * | 9/2009 | Barnes ........................... | 709/224 |
| 7,613,155 | B2 * | 11/2009 | Shim .............................. | 370/338 |
| 8,125,985 | B1 * | 2/2012 | Aybay et al. ................... | 370/359 |

(Continued)

FOREIGN PATENT DOCUMENTS

| | | |
|---|---|---|
| CN | 1481176 A | 3/2004 |
| CN | 1802837 A | 7/2006 |

(Continued)

OTHER PUBLICATIONS

Schoedel, Eric., "Gigabit Wireless for Network Connectivity", Nov. 2, 2009, Retrieved at <<http://www.educause.edu/EDUCAUSE+Quarterly/EDUCAUSEQuarterlyMagazineVolum/GigabitWirelessforNetworkConne/174585 >>, pp. 4.

(Continued)

*Primary Examiner* — Lynn Feild
*Assistant Examiner* — Keyvan Emdadi
(74) *Attorney, Agent, or Firm* — Heikki Einola; Judy Yee; Micky Minhas (57) ABSTRACT

Described is a technology by which additional network communications capacity is provided to an oversubscribed base network where needed, through the use of dynamically provisioned communications links referred to as flyways. A controller detects a need for additional network communications capacity between two network machines, e.g., between two racks of servers with top-of-rack switches. The controller configures flyway mechanisms (e.g., one per rack) to carry at least some of the network traffic between the machines of the racks and thereby provide the additional network communications capacity. The flyway mechanisms may be based on any wireless or wired technologies, including 60 GHz technology, optical links, 802.11n or wired commodity switches.

20 Claims, 4 Drawing Sheets

(56) References Cited

U.S. PATENT DOCUMENTS

| | | | |
|---|---|---|---|
| 2002/0184383 A1* | 12/2002 | Song | 709/236 |
| 2003/0076846 A1 | 4/2003 | Heinz et al. | |
| 2005/0027862 A1 | 2/2005 | Nguyen et al. | |
| 2006/0245406 A1* | 11/2006 | Shim | 370/338 |
| 2006/0271655 A1 | 11/2006 | Yoon et al. | |
| 2006/0271666 A1 | 11/2006 | Jones et al. | |
| 2007/0189191 A1* | 8/2007 | Ades | 370/254 |
| 2007/0280124 A1 | 12/2007 | Bivens et al. | |
| 2008/0130616 A1* | 6/2008 | Wengerter et al. | 370/345 |
| 2008/0225474 A1* | 9/2008 | Flynn et al. | 361/683 |
| 2008/0239983 A1 | 10/2008 | Bivens | |
| 2008/0275975 A1* | 11/2008 | Pandey et al. | 709/223 |
| 2009/0154766 A1* | 6/2009 | Quine et al. | 382/101 |

FOREIGN PATENT DOCUMENTS

| | | |
|---|---|---|
| JP | 2000232483 A | 8/2000 |
| JP | 2004228828 A | 8/2004 |

OTHER PUBLICATIONS

Robinson, Rick., "New Wireless 60 GHz Standard Promises Ultra-Fast Applications ", Jan. 15, 2009, Retrieved at <<http://www.physorg.com/news151258225.html>>, pp. 9.

Wells, Jonathan., "Multigigabit Wireless Connectivity at 70, 80 and 90 GHz ", May 1, 2006, Retrieved at <<http://mobiledevdesign.com/hardware_news/radio_multigigabit_wireless_connectivity/>> pp. 8.

Mellor, Chris., "VirtenSys PCIe Cloud Switch Arrives", Feb. 24, 2009, Retrieved at <<http://www.theregister.co.uk/2009/02/24/vitensys_pcie_switch/>>, pp. 2.

"Advance Program", May 20, 2007, Retrieved at <<http://www.ieee.org/organizations/society/leos/LEOSCONF/HSD2007/AdvanceProgram.pdf>>, pp. 7.

Handigol, et al., "Plug-n-Serve: Load-Balancing Web Traffic using OpenFlow", 2009, Retrieved at <<http://conferences.sigcomm.org/sigcomm/2009/demos/sigcomm-pd-2009-final26.pdf>>, pp. 2.

"Sun Steps Up With Terascale Computing and On-Demand Capacity", 1994-2009, Retrieved at <<http://www.sun.com/aboutsun/media/features/terascale.html>>, pp. 2.

McGillicuddy, Shamus., "Cisco Expands Nexus Data Center Switch Line with Eye on Virtualization", Jan. 28, 2009, Retrieved at <<http://searchnetworking.techtarget.com/news/article/0,289142,sid7_gci1346229,00.html#>>, pp. 4.

Untz, et al., "On Demand Label Switching for Spontaneous Edge Networks", Sep. 3, 2004, Retrieved at <<http://delivery.acm.org/10.1145/1020000/1016714/p35-untz.pdf?key1=1016714&key2=2867245521&coll=GUIDE&dl=GUIDE&CFID=56224706&CFTOKEN=73208416>>, pp. 35-42.

"Deploying 10 Gigabit Ethernet with Cisco Nexus 5000 Series Switches", Oct. 13, 2009, Retrieved at <<http://www.cisco.com/en/US/prod/collateral/switches/ps9441/ps9670/white_paper_c27-489248_ns783_Networking_Solutions_White_Paper.html>>, p. 1.

"International Search Report", Mailed Jun. 16, 2011, Application No. PCT/US2010/051698 Filed Date Oct. 6, 2010, pp. 1-11.

"Office Action and Search Report Issued in Chinese Patent Application No. 201080045182.4", Mailed Date: Dec. 20, 2013, 11 Pages.

"Office Action and Search Report Issued in Chinese Patent Application No. 201080045182.4", Mailed Date: Aug. 7, 2014, 15 Pages.

"Office Action Issued in Japanese Patent Application No. 2012-533293", Mailed Date: May 21, 2014, 8 Pages.

* cited by examiner

FIG. 4

FLYWAYS IN DATA CENTERS

CROSS-REFERENCE TO RELATED APPLICATION

The present application claims priority to U.S. provisional patent application Ser. No. 61/250,013, filed Oct. 9, 2009.

BACKGROUND

Large network data centers provide economies of scale, large resource pools, simplified IT management and the ability to run large data mining jobs. Containing the network cost is an important consideration when building large data centers. Networking costs are one of the major expenses; as is known, the cost associated with providing line speed communications bandwidth between an arbitrary pair of servers in a server cluster generally grows super-linearly to the size of the server cluster.

Production data center networks use high-bandwidth links and high-end network switches to provide the needed capacity, but they are still oversubscribed (lacking capacity at times) and thus suffer from sporadic performance problems. Oversubscription is generally the result of a combination of technology limitations, the topology of these networks (e.g., tree-like) that requires expensive "big-iron" switches, and pressure on network managers to keep costs low. Other network topologies have similar issues.

SUMMARY

This Summary is provided to introduce a selection of representative concepts in a simplified form that are further described below in the Detailed Description. This Summary is not intended to identify key features or essential features of the claimed subject matter, nor is it intended to be used in any way that would limit the scope of the claimed subject matter.

Briefly, various aspects of the subject matter described herein are directed towards a technology by which additional network communications capacity is provided to an oversubscribed base network through the use of communications links referred to as flyways. In general, each flyway comprises an additional network communication path between network machines that may be dynamically set up as needed, and torn down as desired.

In one implementation, each rack of servers in a network has, an associated flyway mechanism that can communicate with other flyway mechanisms. The flyway mechanisms may be based on wireless or wired technologies. A controller dynamically provisions a flyway upon detecting a need for additional network communications capacity between the two racks by having the flyway mechanisms communicate with one another. Once provisioned, the additional communications link between machines is used to carry at least some of the network traffic between those machines.

Other advantages may become apparent from the following detailed description when taken in conjunction with the drawings.

BRIEF DESCRIPTION OF THE DRAWINGS

The present invention is illustrated by way of example and not limited in the accompanying figures in which like reference numerals indicate similar elements and in which.

DETAILED DESCRIPTION

Various aspects of the technology described herein are generally directed towards a network design that retains the benefits of existing networks, yet substantially improves their performance. To this end, there is described a hybrid architecture in which a base network (including whether tree-like or mesh-like) is provisioned for the average case (and is thus oversubscribed), but handles hotspots through the inclusion of extra links that are added on an on-demand basis to provide additional capacity where and when it is needed in the network. As used herein, such links are referred to as flyways. Note that future network designs (e.g., Clos networks) also can be enhanced by the technology described herein. As will be understood, the enhanced design allows networks to maintain their performance as they scale-up in server counts, without significant increase in the quantity and the cost of networking equipment.

It should be understood that any of the examples described herein are non-limiting examples. As such, the present invention is not limited to any particular embodiments, aspects, concepts, structures, functionalities or examples described herein. Rather, any of the embodiments, aspects, concepts, structures, functionalities or examples described herein are non-limiting, and the present invention may be used in various ways that provide benefits and advantages in computing and computer networks in general.

Figure 1:
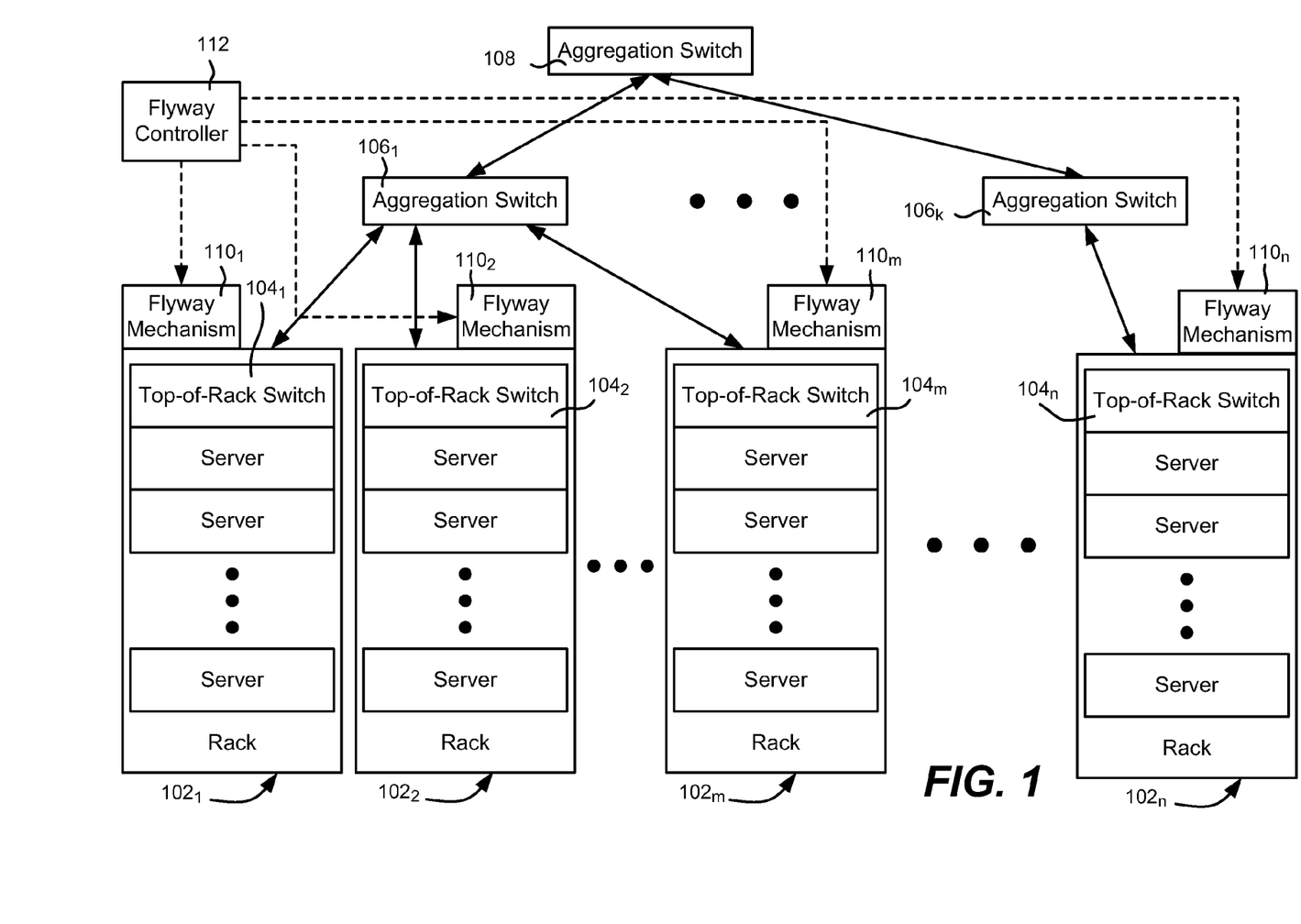
FIG. 1 is a block diagram showing an example data center incorporating flyway mechanisms by which flyways may be established.

FIG. 1 shows a production network based upon a tree-like topology. A plurality of racks $102_1$-$102_n$ each have servers, which communicate through a top of rack switch $104_1$-$104_n$. A typical network has twenty to forty servers per rack, with increasingly powerful links and switches going up the tree. Note that flyways are not limited to tree-like topologies, but can be used in any topology, including close networks and other forms of mesh topologies, and FatTree topologies.

As represented in FIG. 1, each top of rack switch $104_1$-$104_n$ is coupled to one another through one or more aggregation switches $106_1$-$106_k$. In this way, each server may communicate with any other server, including a server in a different rack. Note that in this example, a higher-level aggregation switch 108 couples the rack-level aggregation switches $106_1$-$106_k$, and there may be one or more additional levels of aggregation switch couplings.

Application demands generally can be met by an oversubscribed network, but occasionally the network does not have sufficient capacity to handle "hotspots." The technology described herein provides the additional capacity through the use of flyways to handle extra data traffic as needed.

Figure 2:
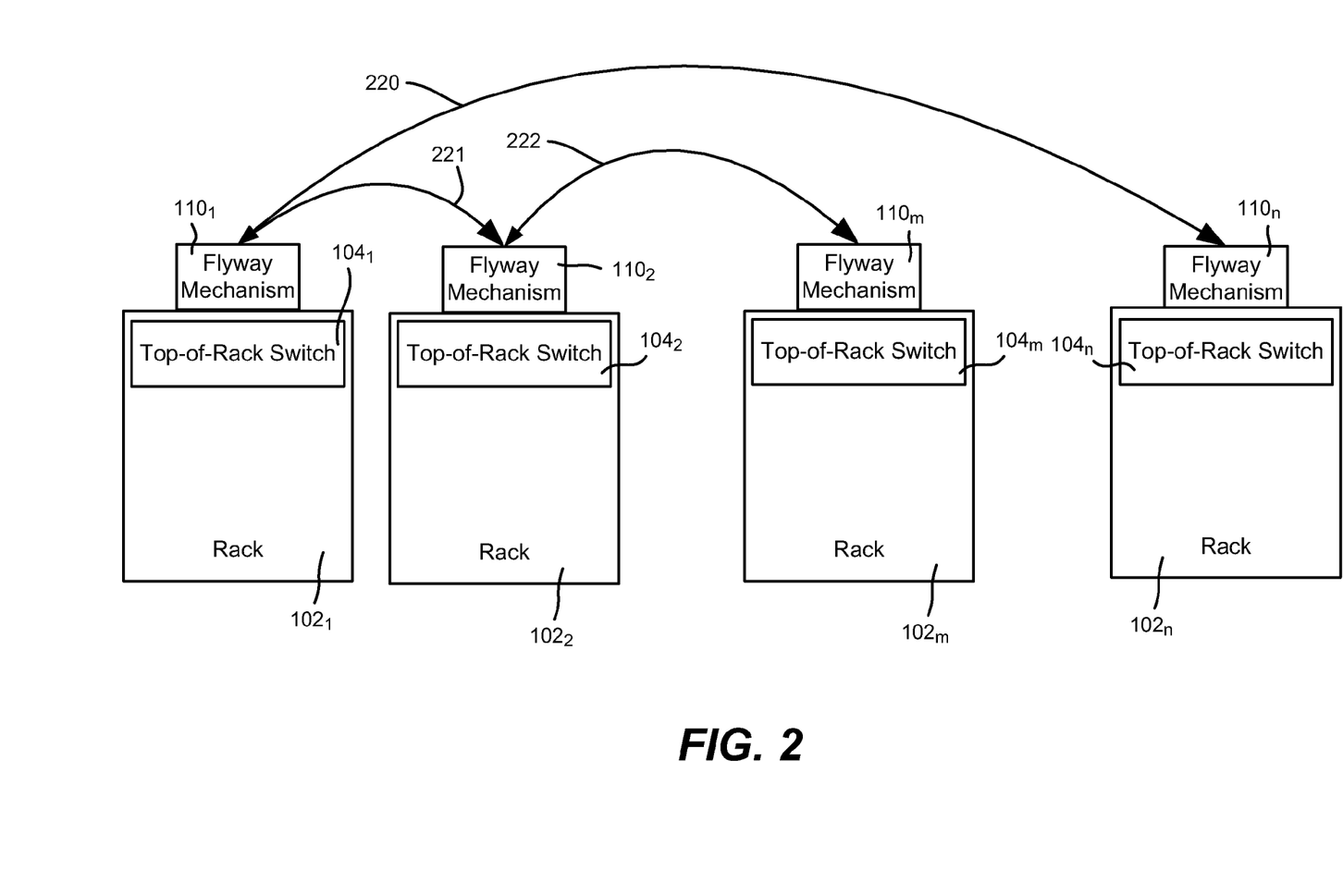
FIG. 2 is a representation of flyways set up between network machines.

As represented in FIGS. 1 and 2, flyways (the curved arrows in FIG. 2) are implemented via flyway mechanisms $110_1$-$110_n$ that are controlled by a flyway controller 112. The flyways may be dynamically set up by the flyway controller 112 on an as-needed basis, and taken down when not needed (or needed elsewhere). FIG. 2 shows how one flyway 220 may be used to link racks $102_1$ and $102_n$ and their respective top-of-rack switches $104_1$ and $104_n$, while another flyway 222 links racks $102_2$ and $102_m$ and their respective top-of-rack switches $104_2$ and $104_n$. Note that a rack/top-of-rack switch may have more than one flyway at any time, as represented by the flyway 221 between racks 102$_1$ and 102$_2$. While a single flyway mechanism is shown per rack, it can be appreciated that there may be more than one flyway mechanism per rack (or multiple devices in a single flyway mechanism), possibly using different communications technologies (e.g., wireless and optical).

Analysis of traces from data center networks shows that, at any time, only a few top-of-rack switches are "hot," that is, they are sending and/or receiving a large volume of traffic. Moreover, when hot, top-of-rack switches typically exchange much of their data with only a few other top-of-rack switches. This translates into skewed bottlenecks, in which just a few of the top-of-rack switches lag behind the rest and hold back the entire network. The flyways described herein provide extra capacity to these few top-of-rack switches and thus significantly improve overall performance. Indeed, only a few flyways, with relatively low bandwidth, significantly improve the performance of an oversubscribed data center network.

Flyways may be added to a network at a relatively small additional cost. This may be accomplished by the use of wireless links (e.g., 60 GHz, optical links and/or 802.11n) and/or the use of commodity switches to add capacity in a randomized manner. In general, any flyway mechanism can link to any other flyway mechanism, as long as they meet coupling requirements (e.g., within range for wireless, has line-of-sight for optical and so on).

Thus, the flyways may be implemented in various ways, including via wireless links that are set up on demand between the flyway mechanisms (e.g., suitable wireless devices), and/or commodity switches that interconnect subsets of the top-of-rack switches. As described below, 60 GHz wireless technology is one implementation for creating the flyways, as it supports short range (1-10 meters), high-bandwidth (1 Gbps) wireless links. Further, the high capacity and limited interference range of 60 GHz provides benefits.

The performance of a flyway-enhanced oversubscribed network may approach or even equal to that of a non-oversubscribed network. One way to achieve the most benefit is to place flyways at appropriate locations. Note that network traffic demands are generally predictable/determinable at short time scales, allowing the provisioning of flyways to keep up with changing demand. As described herein, the central flyway controller 112 gathers demand data, adapts the flyways in a dynamic manner, and switches paths to route traffic.

Wireless flyways are able to form links on demand, and thus may be used to distribute the available capacity to whichever top-of-rack switch pairs need it as determined by the central flyway controller 112. Wired flyways provide equivalent benefits; when inexpensive switches are connected to subsets of the top-of-rack switches, the limited backplane bandwidth at these switches can be divided among whichever of the many top-of-rack switch pairs that are connected need it. Wired flyways are somewhat more restrictive in that only if a top-of-rack switch pair happen to be connected via one of the flyway switches, can they directly benefit from a flyway (although multi-hop flyways are one alternative that allows indirect benefits, as described below). However, wired flyways are more likely to keep up with wired speeds (for example, as NICs go up to 10 Gbps and links go to 40 Gbps). In any event, flyways provide benefits relative to the alternative of spreading the same bandwidth across all racks, as much of it will go unused on links that do not need it. Further, flyways can be deployed today on existing topologies of production data centers.

To add flyways to provide extra capacity between hot top-of-rack switches and some other top-of-rack switches with which they exchange traffic, pairs of flyway mechanisms that provide the most speedup may be selected. Each flyway also needs sufficient capacity. Establishing a flyway between a rack with a top-of-rack switch that is the most congested and another rack with which the switch exchanges the most data is straightforward. However subsequent choices are less clear, e.g., whether to establish another flyway at the same rack or elsewhere needs to be considered.

In general, spreading flyways too thinly, or concentrating them at a few top-of-rack switches does not work particularly well. For example, placing one flyway each between the top fifty top-of-rack switches and their largest correspondent does not sufficiently reduce the completion time of the hot top-of-rack switch. Conversely, placing flyways between the top five top-of-rack switches and each of their ten largest correspondents eliminates congestion at the top five, but results in the sixth top-of-rack switch ending up as the bottleneck. In general, achieving a proper balance between helping more top-of-rack switches and reducing enough congestion at every one of the hot top-of-rack switches obtains the most speedup. One suitable algorithm for flyway placement is described below.

With respect to how much capacity each flyway needs, consider an example of adding flyways between the top ten top-of-rack switches and each of the five other top-of-rack switches with which they exchange the most data (i.e., a total of fifty flyways). Most flyways need less than ten percent the top-of-rack switch's uplink bandwidth to be useful; one reason is that while the top-of-rack switch's uplink carries traffic to all of the other top-of-rack switches, a flyway has to only carry traffic to one other top-of-rack switch.

The usefulness of flyways generally results from application characteristics that cause sparse demand matrices. Though flyways may not provide benefits for all demands, a large set of practical applications benefit from flyways. For example, in data centers that support web services, the request traffic is load balanced across servers, each of which in turn assembles a response page by possibly asking a few other servers to generate parts of the response (e.g., advertisements). The reduce part of map-reduce in data mining jobs is possibly a worst case scenario, with each reducer pulling data from all the mappers; the job is bottlenecked until all the reducers complete. Even then, it is rare to have so many mappers and reducers that all top-of-rack switches are congested simultaneously.

Turning to 60 GHz wireless communications and the like, millimeter wavelength wireless communications has rapidly advanced, and is a suitable technology for constructing flyways in a data center. The 60 GHz frequency band is a 7 GHz wide band (57-64 GHz) that was set aside by the FCC in 2001 for use by unlicensed devices. The channel bandwidth specified by ISO and IEEE is 2.160 GHz. The substantially larger bandwidth in the 60 GHz band facilitates higher capacity links. For example, a simple encoding scheme that achieves as little as 1 bps/Hz makes it possible to construct a link with a nominal bandwidth of 7 Gbps. As better modulation and coding techniques are implemented, 60 GHz devices will likely become spectrally efficient and seven orthogonal 1 Gbps channels will be common, and 1 Gbps link speeds are adequate for constructing flyways. Note that 4-5 Gbps link speeds are already available using multiple channels in the 60 GHz band.

In addition to capacity, other characteristics of 60 GHz communications make it particularly attractive for instantiating flyways. For one, 60 GHz devices have a relatively short range (5 to 10 meters). In wireless communications path, loss is directly proportional to the square of the frequency and so 60 GHz signals attenuate more quickly with distance when compared with 2.4 and 5 GHz Wi-Fi signals. For another, highly directional 60 GHz communications are easy to achieve. Because signal wavelength is inversely proportional to frequency, 60 GHz signals have very short wavelengths (5 mm) and this allows RF chip designers to incorporate antenna arrays into the transceiver chips. The ability to integrate many antennas and transceivers with proper phasing into a single chip allows beam-forming and hence directional communication. Additionally, phased-array antennas boost signal quality leading to a cleaner signal with low bit error rates at short distances. For example, a one-square inch antenna provides a signal boost of 25 dBi at 60 GHz. A side benefit of the integration of the antennas on the chip is that this avoids the need for wires to carry signals to and from the chip, reducing the cost of packaging by up to two orders of magnitude.

The low range and high capacity directional links are beneficial in data centers where server racks are typically packed tightly as physical space is a premium resource, and mobility and a power draw of approximately ten watts per server rack is a non-issue. Directionality allows the network designers to increase the overall spectrum efficiency through spatial reuse. For example, two sets of communications between four top-of-rack switches can occur simultaneously because of directionality and range.

Figure 3:
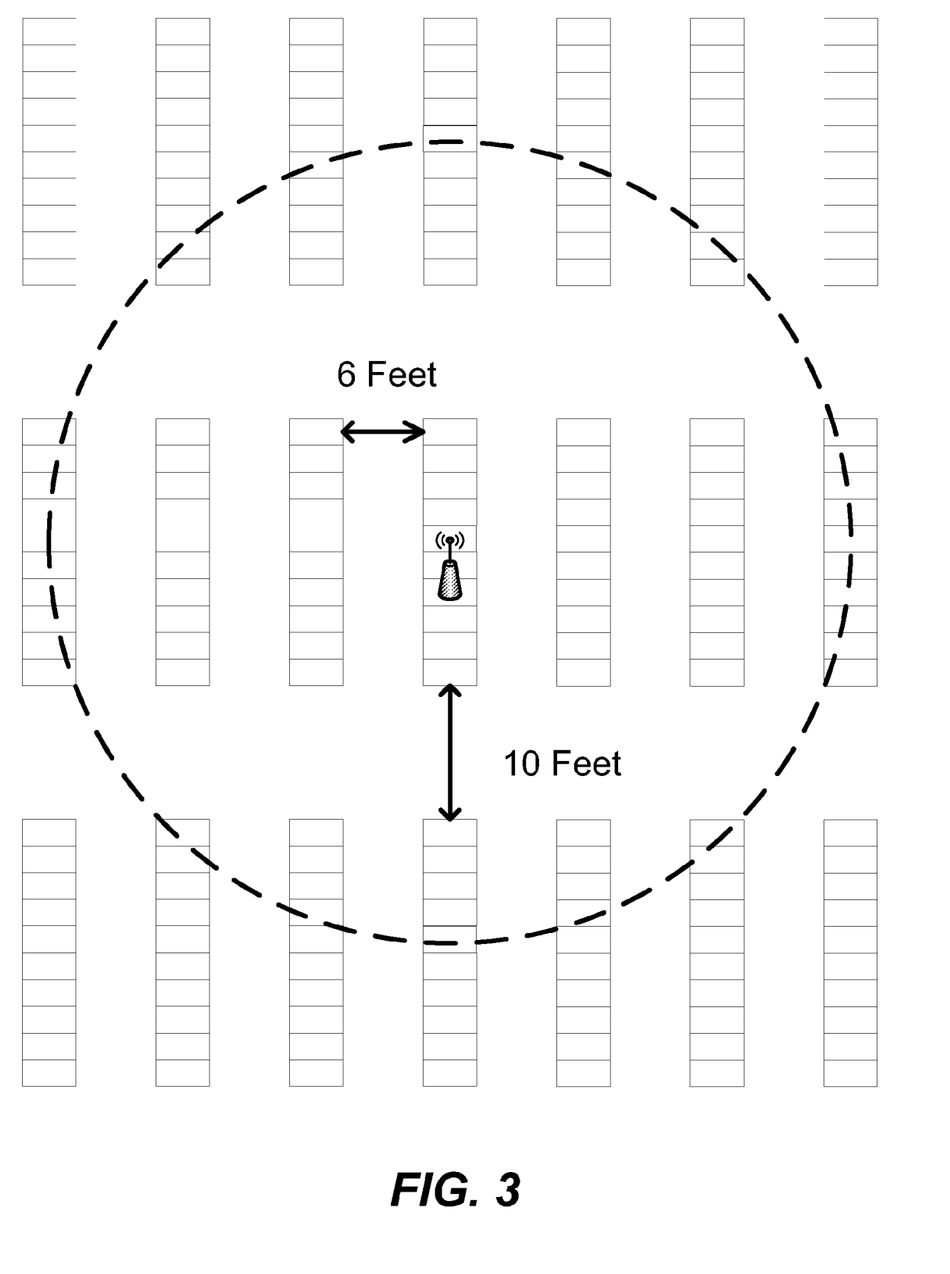
FIG. 3 is a representation of a partial data center showing server racks and the range of an example 60 GHz device mounted atop a rack near the center of a set of racks.

In a typical data center server, racks are about 24 inches wide and are arranged in a dense, regular pattern as shown in FIG. 3. In FIG. 3, each box represents a 24×48 inch rack, for example, arranged in rows of ten. The circle represents the 10 m range of a 60 GHz device mounted atop a rack in the center, which contains about 70 other racks. Using directional antennas, small (2-3 cubic inches) 60 GHz network cards mounted on top of the racks can instantiate multiple non-interfering gigabit flyways between several racks on an as needed basis. Electronically steerable phased-array antennas with beam widths of about 60 degrees can be steered with millisecond latency.

Note that directionality comes with consequences. For example, discovery is no longer straightforward and the popular medium access control protocols that work well for omni-directional communications have to be modified. Notwithstanding, this is a well-understood problem in the research community and many solutions exist. The IEEE and ISO 60 GHz working groups are actively working on incorporating support for directional communications and spatial reuse. Although their primary scenario is in-home multimedia communications, the solutions they are discussing can be modified to apply to data center networks. Specifically, because of the way the network is configured and the scale of the network, the problem may be solved because there exists a back-channel connection, often wired, between all discoverable top-of-rack switches that can be turned into a control channel. The control channel can then be used to discover top-of-rack switches, align 60 GHz beams, allocate channels for interference mitigation, and arbitrate collision-free medium access.

Another issue with 60 GHz is that at these high-frequencies, signals are absorbed by objects and non-line-of-sight (NLOS) communications is not possible. However, in data centers, devices may be mounted on top of the racks and out of the way of human operators, whereby line-of-sight is not interrupted. Moreover, recent advances in technology have started to overcome this limitation.

As noted above, the large amount of spectrum combined with improving spectral efficiency allows many flyways to be constructed and operated independently (with a 10 bits/Hz spectral efficiency, up to 70 flyways each operating at 1 Gbps can be constructed). This combined with the properties of low interference due to directionality, and low range due to path loss allows significant frequency reuse over thousands of server racks present in the data center.

Moreover, unlike other high bandwidth wireless technologies, the 60 GHz band is available world-wide. Thus, chipsets and devices are usable all over the world and providing economies of scale and pushing the cost down.

Turning to implementing a network with flyways, to form a flyway between a pair of top-of-rack switches, one or more devices placed atop the corresponding racks create a wireless link. The choice of technology affects the available bandwidth, the number of channels available for spatial re-use, interference patterns and the range of the flyway. The antenna technology dictates the time needed to setup and tear down a flyway. Note that adding a few wireless devices per top-of-rack switch increases cost only marginally.

Wired flyways may be constructed by using additional switches, such as of the same make as contemporary top-of-rack switches that interconnect random subsets of the top-of-rack switches, e.g., commodity switches may interconnect twenty top-of-rack switches with 1 Gbps links each. To keep links short, the flyway switches may connect racks that are near to one another in the datacenter. When deploying wired flyways, spectrum allocation or interference is not an issue. However, their random construction constrains wired flyways; e.g., top-of-rack switch pairs that exchange a lot of traffic and can benefit from surplus capacity may end up without a wired flyway.

In any event, either wired or wireless flyway construction is an improvement compared to dividing the same amount of bandwidth uniformly across all pairs of top-of-rack switches. Rather than spread bandwidth uniformly and have much of it wasted, as happens when the demand matrix is sparse, flyways provide a way to use the spare bandwidth to target the parts of the demand matrix that can benefit the most from surplus capacity.

The central flyway controller 112 (FIG. 1) gathers estimates of demands between pairs of the rack switches. For example, information can be gathered from lightweight instrumentation at the end servers themselves, or by polling SNMP counters at the switches. Using these estimates, the controller 112 may periodically or otherwise run a placement algorithm (described below) to place the available flyways.

The topology of a flyway-based network is thus dynamic, and requires multipath routing. Solutions to similar problems are known. The controller 112 determines how much of the traffic between a pair of top-of-rack switches go along the base network, or instead take a flyway from the sending top-of-rack switch to the receiving top-of-rack switch, if one exists. The top-of-rack switch splits traffic as per this ratio by assigning different flows onto different MPLS (Multiprotocol Label Switching) label switched paths. Note that only a few flyways, if any, are available at each top-of-rack switch. Hence, the number of LSPs (label switched paths) required at each switch is small and the problem of splitting traffic across the base and flyways that are one hop long is significantly simpler than other traffic splitting techniques.

The problem of creating optimal flyways can be considered an optimization problem. Given $D_{ij}$ demand between top-of-rack switches i, j and if $C_l$ is the capacity of link l, an optimal routing is the one that minimizes the maximum completion time:

$$\text{such that minmax} \frac{D_{ij}}{r_{ij}} \quad (1)$$

$$\sum_{l \in \text{incoming}} r_{ij}^l - \sum_{l \in \text{outgoing}} r_{ij}^l = \begin{cases} D_{ij} & \text{at } ToRj \\ -D_{ij} & \text{at } ToRi \\ 0 & \text{at all other } ToRs \end{cases}$$

$$\sum_{ij} r_{ij}^l \leq C^l \forall \text{ links } l$$

where $r_{ij}$ is the rate achieved for the top-of-rack switch pair i, j and $r_{ij}^l$ is the portion of that pair's traffic on link l.

Computing an optimal 1 near optimal flyway placement involves suitably changing the topology and re-solving the above optimization problem. For example, all possible flyways may be added, with the constraint that no more than a certain number can be simultaneously active, or that none of the flyways can have a capacity larger than a certain amount. Not all the variants of the above optimization problem, induced due to technological constraints, may be tractable. Instead, greedy procedures may be used that add one flyway at a time by solving the above optimization problem to find the flyway that reduces completion times the most. Other procedures may be better approximations.

Figure 4:
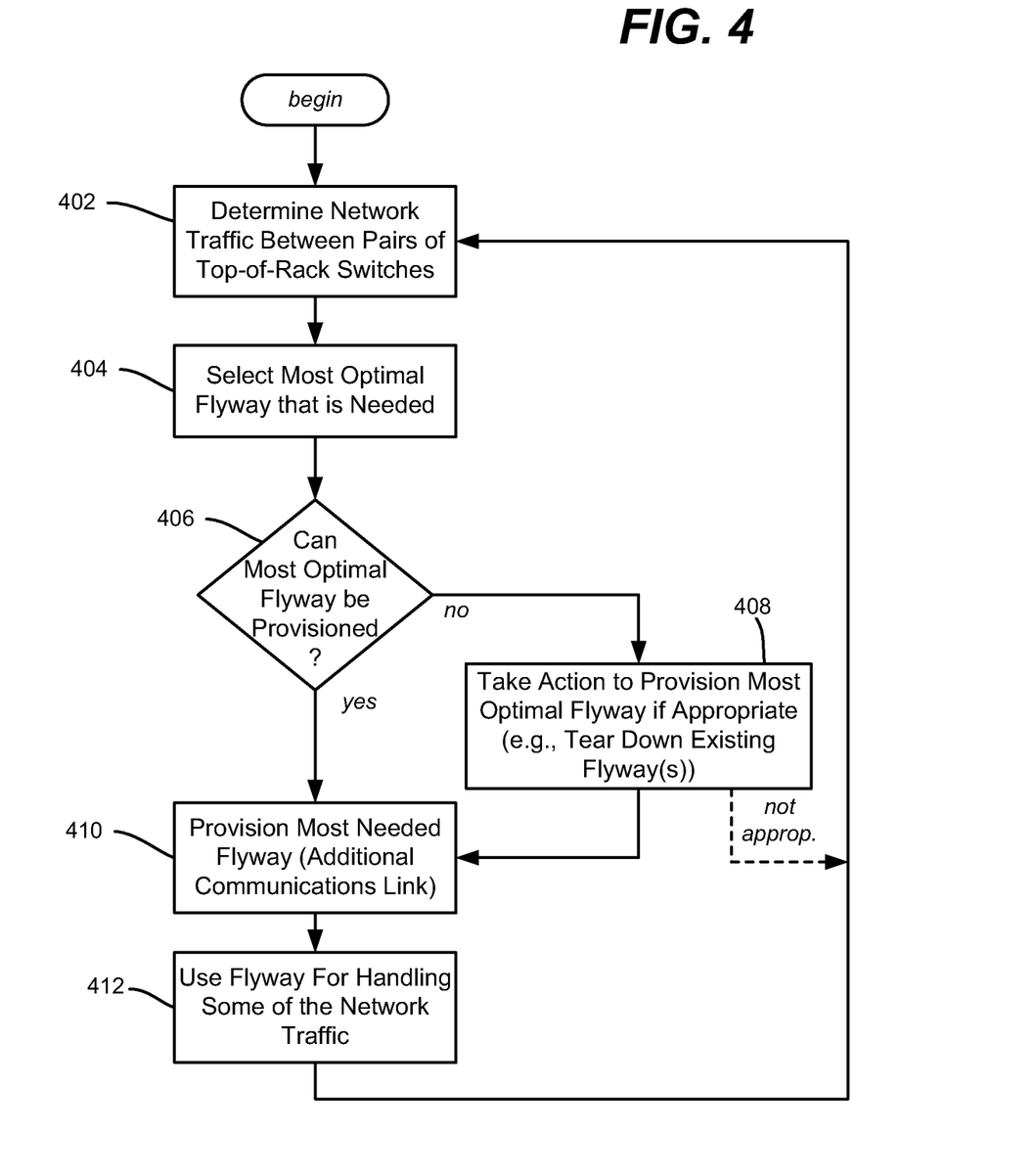
FIG. 4 is a flow diagram showing example steps for provisioning a flyway between a pair of network machines.

An example is generally represented in the example flow diagram of FIG. 4, beginning at step 402 which represents gathering the network traffic data for the pairs being considered. In general, based on the traffic data, the most optimal flyway that is needed (e.g., the switches are hot but a flyway is not already provisioned) between two selected pairs of machines (top-of-rack switches) is selected at step 404.

Note that a flyway also may be used to provide connectivity to racks whose primary connections to the rest of the racks have failed. Such a failure-compensating flyway (or flyways) may be considered the most optimal flyway that is needed at step 404, for example, or may be separately considered, such as before selecting others based upon capacity.

Step 406 represents evaluating whether that most optimal flyway can be provisioned; for example, if the total number of flyways is a constraint, there may not be another flyway available at this time. However, if there is not a flyway available, yet the most optimal non-provisioned flyway is more needed that another flyway that is currently provisioned, step 408 may tear down that other flyway (or flyways, if a multi-hop scenario is in use as described below) so that a flyway becomes available. For example, the least needed flyway may be torn down.

Note however that it may not be appropriate to tear down a flyway. For example, it may be that all of the already provisioned flyways are handling even more traffic and thus are more needed than a flyway for the selected pair at step 404, in which case no action is taken (e.g., the dashed line from step 408).

Step 410 provisions the most optimal flyway (if appropriate). Once provisioned, the flyway may be used to handle at least some of the network traffic between the selected pair, as represented by step 412. The process then repeats. Note that FIG. 4 is only one example; as an alternative, up to the top-N most optimal flyways that are not already provisioned may be added between each polling of the pairs at step 402.

With flyways, the physical topology of a network needs to be considered, as well as constraints due to the technology. Wireless flyways are constrained by range, while wired flyways, which are constructed by inter-connecting random subsets of top-of-rack switches, can only provide surplus capacity between these random subsets. 60 GHz flyways span a distance of ten meters and use the datacenter layout (e.g., FIG. 3) from a production data-center. For wired flyways, 24 port, 1 Gbps switches may be used, with some of the ports used for the flyway channel. Although such constraints impact the benefit of flyways, the gains are still significant.

Note that many more wired flyways need to be added to obtain the same benefits of wireless flyways. For example, when fifty 24-port switches are added, 1,200 duplex links are added to the network. Wireless flyways provide equivalent performance with only 50 half-duplex links. Thus is because wireless flyways are added in a targeted manner: they help speed up those pairs of top-of-rack switches that need additional capacity. Wired flyways are added at random, and benefit pairs only if they happen to be among the ones chosen.

Multi-hop flyways are feasible. Consider that a machine in FIG. 3 within the circle wants to communicate with a machine outside of the circle. However, a second hop from a machine inside the circle that is close enough to another machine can be used to accomplish the communication.

Further, the controller 112 (FIG. 1) can consider whether two machines (e.g., A and Z) are outside of single hop range. If so, a flyway may be constructed between two other machines (e.g., C and M) that are close but communicating via the top-of-rack switches, with their communication switched to the flyway. The bandwidth savings provided by the newly constructed flyway for C and M then may be used to free up the top-of-rack switches to allow the machines A and Z to communicate using the top-of-rack switches.

While the invention is susceptible to various modifications and alternative constructions, certain illustrated embodiments thereof are shown in the drawings and have been described above in detail. It should be understood, however, that there is no intention to limit the invention to the specific forms disclosed, but on the contrary, the intention is to cover all modifications, alternative constructions, and equivalents falling within the spirit and scope of the invention.

What is claimed is:

1. In a computer networking environment, a system comprising:
    a number of racks of servers, each rack of servers having at least one switch coupled to at least one other switch associated with another rack of servers to provide network communications capacity between the servers; and
    a set of flyway mechanisms dynamically provisioned to communicate with one another to provide additional network communications capacity via wireless technology, including one flyway mechanism coupled to a first rack of servers, the flyway mechanism configured to communicate with another flyway mechanism coupled to a second rack of servers.

2. The system of claim 1 further comprising:
    a controller configured to detect a need for the additional network communications capacity, wherein the set of flyway mechanisms are dynamically provisioned to communicate with one another by the controller.

3. The system of claim 1 wherein the oversubscribed base network is configured in a tree-like topology.

4. The system of claim 1 wherein the oversubscribed base network is configured in a mesh topology.

5. The system of claim 1 wherein the flyway mechanisms are based at least in part on a physical layout of the network.

6. The system of claim 1 wherein the wireless technology comprises 60 GHz frequency band technology.

7. The system of claim 1 wherein the wireless technology comprises optical links.

8. The system of claim 1 wherein the wireless technology comprises 802.11-based Wi-Fi technology.

9. The system of claim 1 wherein a network path is constructed using one or more flyways established by the flyway mechanism and at least one other flyway mechanism.

10. One or more computer storage media having computer-executable instructions, which in response to execution by a computer, cause the computer to perform steps, comprising:
   determining network traffic between a number of racks of servers, each rack of servers having at least one switch coupled to at least one other switch associated with another rack of servers to provide network communications capacity between the servers; and
   based upon the network traffic, dynamically provisioning a wireless communications link between at least two servers, in addition to a base communications network provided by one or more switches, to carry at least some of the network traffic between those at least two servers.

11. The one or more computer storage media of claim 10 having further computer-executable instructions comprising:
   tearing down the communications link.

12. The one or more computer storage media of claim 10 having further computer-executable instructions comprising:
   provisioning another communications link between machines, including using at least one intermediary machine for multi-hop communication.

13. The one or more computer storage media of claim 12 wherein determining the network traffic comprises communicating with server machines or polling switches, or both communicating with server machines and polling switches.

14. The one or more computer storage media of claim 12 wherein provisioning the communications link comprises running a placement algorithm to select the machines between which the communications link is provisioned.

15. In a computing environment, a method performed on at least one processor, comprising:
   determining network traffic between a number of racks of servers, each rack of servers having at least one switch coupled to at least one other switch associated with another rack of servers to provide network communications capacity between the number of racks of servers;
   selecting, based on the network traffic, a selected pair of machines that does not already have a flyway provisioned between that selected pair of machines; and
   dynamically provisioning a flyway between that selected pair of machines to provide an additional wireless communications path between the networked machines in addition to a base communications network provided by the at least one switch and the at least one other switch.

16. The method of claim 15 further comprising:
   tearing down a flyway between another pair of machines.

17. The method of claim 15 wherein selecting the selected pair of machines comprises running a placement algorithm to compute an optimal routing.

18. The method of claim 15 further comprising:
   provisioning at least two flyways to enable multi-hop network communication between two machines that are unable to communicate over a single flyway.

19. The method of claim 15 wherein the wireless technology comprises 60 GHz frequency band technology.

20. The method of claim 15 wherein the wireless technology comprises optical links.

* * * * *